(12) United States Patent
Tan et al.

(10) Patent No.: US 11,982,706 B2
(45) Date of Patent: May 14, 2024

(54) APPARATUS, TRANSFER METHOD, CHAMBER AND FRAME FOR SEMICONDUCTOR BURN-IN PROCESS

(71) Applicant: MSV SYSTEMS & SERVICES PTE LTD, Singapore (SG)

(72) Inventors: Teck Huat Tan, Singapore (SG); Chun Hong Low, Singapore (SG)

(73) Assignee: MSV SYSTEMS & SERVICES PTE LTD, Singapore (SG)

( * ) Notice: Subject to any disclaimer, the term of this patent is extended or adjusted under 35 U.S.C. 154(b) by 242 days.

(21) Appl. No.: 17/608,632

(22) PCT Filed: Dec. 30, 2020

(86) PCT No.: PCT/SG2020/050791
§ 371 (c)(1),
(2) Date: Nov. 3, 2021

(87) PCT Pub. No.: WO2022/146225
PCT Pub. Date: Jul. 7, 2022

(65) Prior Publication Data
US 2023/0251305 A1 Aug. 10, 2023

(51) Int. Cl.
*G01R 31/28* (2006.01)
(52) U.S. Cl.
CPC ..... *G01R 31/2867* (2013.01); *G01R 31/2862* (2013.01); *G01R 31/2863* (2013.01); *G01R 31/287* (2013.01); *G01R 31/2874* (2013.01)
(58) Field of Classification Search
None
See application file for complete search history.

(56) References Cited

U.S. PATENT DOCUMENTS

| 5,317,257 A | 5/1994 | Sakai | |
|---|---|---|---|
| 2006/0071678 A1* | 4/2006 | Norris | G01R 31/2868 324/750.05 |

(Continued)

FOREIGN PATENT DOCUMENTS

| CN | 206387749 U | 8/2017 |
|---|---|---|
| CN | 206710573 U | 12/2017 |

(Continued)

OTHER PUBLICATIONS

Kiyoshi Komatsu et al., JP-10177056-A, Machine Translation, (Year: 1998).*

(Continued)

*Primary Examiner* — Jermele M Hollington
*Assistant Examiner* — Suresh K Rajaputra
(74) *Attorney, Agent, or Firm* — Eschweiler & Potashnik, LLC

(57) ABSTRACT

The present disclosure relates to burn-in apparatus, transfer method, burn-in chamber, and interchangeable frame thereof for semiconductor devices burn-in process. The burn-in apparatus comprises of a burn-in chamber with an incomplete base which is adapted to be completed and thermally insulated in cooperation with a thermal insulation base of at least one interchangeable frame which is adapted to be removably moved into and docked in the burn-in chamber to complete the burn-in apparatus. The burn-in apparatus comprises the burn-in chamber and at least one frame. The apparatus is complete and thermally insulated when the frame is moved into the burn-in chamber and docked therein. The apparatus is incomplete and thermally uninsulated when the frame is moved out of the burn-in chamber and undocked therefrom.

22 Claims, 4 Drawing Sheets

(56) References Cited

U.S. PATENT DOCUMENTS

| | | | |
|---|---|---|---|
| 2006/0208721 A1 | 9/2006 | Soeta et al. | |
| 2019/0204378 A1* | 7/2019 | Gopal | G01R 31/2862 |
| 2019/0235005 A1* | 8/2019 | Ho | G01R 31/2875 |
| 2020/0379033 A1* | 12/2020 | Chang | G01R 31/2868 |
| 2022/0120808 A1* | 4/2022 | Fawcett | G01R 31/2863 |

FOREIGN PATENT DOCUMENTS

| | | | | |
|---|---|---|---|---|
| CN | 111289877 A | | 6/2020 | |
| JP | 10177056 A | * | 6/1998 | G01R 31/00 |
| JP | 2004286499 A | | 10/2004 | |
| JP | 2020060400 A | | 4/2020 | |

OTHER PUBLICATIONS

Patent Cooperation Treaty, "International Search Report and Written Opinion for PCT Patent Application No. PCT/SG2020/050791", Mailed Date: Mar. 29, 2021, 11 pages.

Patent Cooperation Treaty, "International Preliminary Report on Patentability for PCT Patent Application No. PCT/SG2020/050791", Completion Date: Aug. 12, 2021, 22 pages.

Patent Cooperation Treaty, "Written Opinion for PCT Patent Application No. PCT/SG2020/050791", Mailed Date: Jun. 14, 2021, 5 pages.

PCT Search Report dated Mar. 8, 2022 in connection with PCT Application No. PCT/SG2021/050828.

Related U.S Patent Application dated Jun. 19, 2023 in connection with U.S. Appl. No. 18/258,235.

European Search Report dated Nov. 18, 2022, in connection with European Application Serial No. 20934241.9.

* cited by examiner

APPARATUS, TRANSFER METHOD, CHAMBER AND FRAME FOR SEMICONDUCTOR BURN-IN PROCESS

CROSS-REFERENCE TO RELATED APPLICATIONS

This application is a national stage entry of PCT application PCT/SG2020/050791, which was filed on Dec. 30, 2020. That prior application is incorporated by reference herein.

TECHNICAL FIELD

The invention relates to burn-in apparatus for performing burn-in process on the semiconductor devices or integrated circuits, particularly to a burn-in apparatus comprising a burn-in chamber cooperatively operable with one or more interchangeable frames to complete thermal insulation of the chamber, methods for transferring at least one frame in and out of the chamber by respectively completing and uncompleting the thermal insulation of the chamber, methods for transferring a set of burn-in boards being supported on a frame between the burn-in apparatus and at least one other apparatus in the burn-in area, and a burn-in apparatus that incorporates a burn-in chamber and one or more interchangeable frames.

BACKGROUND

Burn-in is a process where semiconductor devices are exposed to high and/or low temperature together with stimulation power supplies and/or signals to eliminate early failure prior to being placed in service.

In this process, a burn-in load/unload apparatus, which is an automated machine, is used to load semiconductor devices onto burn-in boards. The burn-in boards are then loaded into a burn-in system in which the burn-in boards are connected to burn-in drivers which provide stimulation power supplies and signals to the semiconductor devices. Thereafter, the burn-in boards are unloaded from the burn-in system and then the semiconductor devices are unloaded from the burn-in boards by the burn-in load/unload apparatus.

Generally, there are two existing methods for loading or unloading the burn-in boards into or out of the burn-in system.

In a first method, burn-in boards are transported using a wheel rack. To load, an operator moves the wheel rack carrying burn-in boards from the burn-in load/unload apparatus to the burn-in system, opens the door of the burn-in chamber, manually transfers board-by-board from the wheel rack to a rack inside the chamber. After the board transfer is completed, the burn-in boards are manually inserted by the operator or automatically inserted using the chamber board insert mechanism into their respective connectors connected to the burn-in driver. After the board insertion is completed, i.e., burn-in boards are connected to the burn-in driver, the operator closes the chamber door, starts the burn-in process, moves the empty wheel rack away, and parks it at a designated location.

When the burn-in process is completed, to unload, the operator moves an empty wheel rack to the burn-in system, opens the chamber door, extracts the boards manually or automatically using the chamber board extract mechanism from the respective connectors. Once the board extraction is completed, i.e., burn-in boards are disconnected from the burn-in driver, the operator manually transfers board-by-board from the chamber rack to the wheel rack. Once the board transfer is completed, the operator closes the chamber door and moves the wheel rack, carrying the burn-in boards, from the burn-in system away to the burn-in load/unload apparatus.

In this method, the loading and/or unloading of the burn-in boards is manual and therefore physically taxing on the operator. Over time, this can cause operator fatigue resulting in burn-in board damage due to accidental impact against the wheel rack or chamber rack during manual transfer. The operator fatigue is further increased if the loading and/or unloading of the burn-in boards at the burn-in load/unload apparatus is also manual and will result in even more burn-in board damage. Moreover, after the burn-in boards are transferred from the wheel rack to the burn-in system, the empty rack has to be parked at a designated location, thus wasting precious production floor space.

In a second method, burn-in boards are placed inside at least one burn-in board rack. The burn-in board rack is transported by a bulky trolley which may or may not be power-assisted. To load, the operator moves the trolley carrying the burn-in board rack to the burn-in system, opens the door of the burn-in chamber, manually transfers rack-by-rack from the trolley to the chamber. After the rack transfer is completed, the burn-in boards inside the rack are manually inserted by the operator or automatically inserted using the chamber board insert mechanism into their respective connectors connected to the burn-in driver. After the insertion is completed, i.e., burn-in boards are connected to the burn-in driver, the operator closes the chamber door, starts the burn-in process, and moves the empty trolley away and parks it at a designated location.

When the burn-in process is completed, to unload, the operator moves an empty trolley to the burn-in system, opens the chamber door, extracts the boards manually or automatically using the chamber board extract mechanism from the respective connectors. After the board extraction is completed, i.e., burn-in boards are disconnected from the burn-in driver, the operator manually transfers rack-by-rack from the chamber to the trolley. After the rack transfer is completed, the operator closes the chamber door and moves the trolley, carrying the racks loaded with burn-in boards, away to the burn-in load/unload apparatus.

In this method, the size, weight, and cumbersome operation of the trolley and manual transfer of rack between the burn-in system and trolley present a safety and crash hazard. The bulky trolley, if power-assisted, will become bulkier, more cumbersome to operate, and more costly to own and maintain. Moreover, the turning radius of the bulky trolley necessitates a wider walkway in the production area, thus incurring precious production floor space. Furthermore, manual transfer of burn-in rack between the trolley and the burn-in load/unload apparatus further creates safety and crash hazard.

SUMMARY

According to one aspect, a burn-in apparatus for performing burn-in process on the semiconductor devices or integrated circuits, the apparatus comprises: a burn-in chamber having at least one side opening and at least one base opening; at least one door or cover adapted to close the side opening; at least one interchangeable frame which is movable through the side opening and removably dockable in the chamber to close the base opening, each frame having a thermal insulation base having a first and a second side, and a rack arranged at the first side of the thermal insulation base, wherein when the side opening is closed and each frame is removably docked in the chamber, the thermal insulation base is arranged at the base opening and abuts the chamber to complete a thermal insulation of the chamber, and the rack and the first side of the thermal insulation base are inside the chamber while the second side of the thermal insulation base is outside the chamber.

According to another aspect, a method comprises: transferring a set of burn-in boards into a chamber by moving at least one frame into the chamber through a side opening thereof, wherein each frame includes a thermal insulation base and a rack which is arranged at a first side of the thermal insulation base and supports the set of burn-in boards; completing a thermal insulation of the chamber, including: closing a base opening of the chamber by docking the at least one frame in the chamber by arranging the thermal insulation base of each frame at the base opening and abutting the thermal insulation base to the chamber such that the rack and the first side of the thermal insulation base are inside the chamber while a second side of the thermal insulation base is outside the chamber, and closing the side opening; and performing burn-in process on the semiconductor devices arranged in the set of burn-in boards.

The method may further comprise: uncompleting thermal insulation of the chamber, including: unclosing the side opening, and unclosing the base opening by undocking the at least one frame from the chamber; transferring the set of burn-in boards out of the chamber by moving the at least one frame out of the chamber through the side opening.

The method may further comprise: transferring the set of burn-in boards on the frame between the burn-in apparatus and at least one other apparatus in the burn-in area, e.g. burn-in load/unload apparatus, burn-in board pre-check apparatus, burn-in board storage apparatus, burn-in board cleaning apparatus, by moving into and removably docking the at least one frame to one of the above-identified apparatus or other apparatus in the burn-in area.

According to another aspect, the burn-in chamber of the above-described burn-in apparatus is provided.

According to another aspect, the frame of the above-described burn-in apparatus is provided.

The frame may be the common carrier of the burn-in boards for the burn-in chamber and at least one other apparatus in the burn-in area, e.g. burn-in load/unload apparatus, burn-in board pre-check apparatus, burn-in board storage apparatus, burn-in board cleaning apparatus.

In some embodiments, the burn-in chamber includes at least one thermal insulation side element arranged at least partially along the base opening and adapted to abut the thermal insulation base when each frame is removably docked in the chamber.

In some embodiments, when the side opening is closed and each frame is removably docked in the burn-in chamber, the thermal insulation base is arranged at the base opening.

In some embodiments, each frame further includes wheels which may be manual or power assisted, or arrangements which are adapted to be used with autonomous guided vehicle (AGV), wherein the wheels or the arrangements are arranged at the second side of the thermal insulation base.

In some embodiments, electronic circuitry is arranged at the second side of the thermal insulation base, the electronic circuitry may include at least one of the following: communication circuitry, sensor, memory storage, and microprocessor, and is configured to send and/or receive signals at least while the at least one frame is removably docked in the chamber and burn-in process is taking place in the chamber, and/or when the at least one frame is undocked from the chamber.

In some embodiments, the at least one frame includes two or more frames, wherein at least one of the two or more frames is loaded with burn-in boards and wherein at least another of the two or more frames is devoid of burn-in board.

In some embodiments, a plurality of second frames are arranged outside the chamber, wherein the at least one frame is interchangeable with at least one of the second frames.

DETAILED DESCRIPTION

Figure 1:
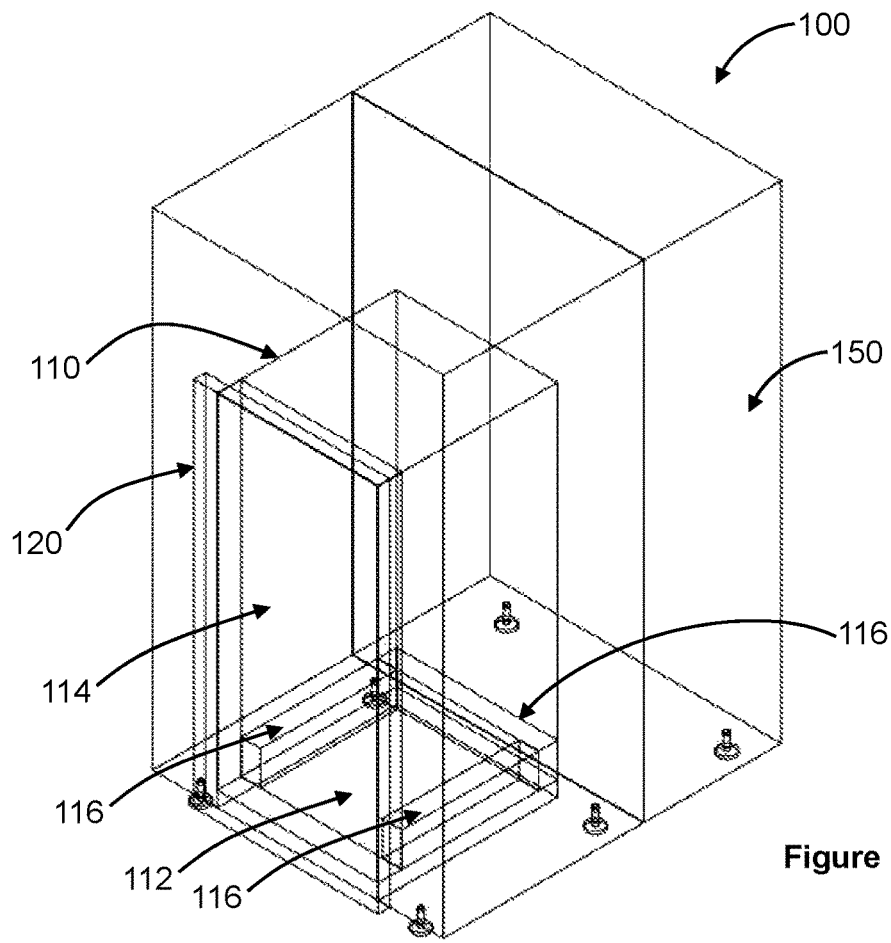
FIG. 1 shows a burn-in chamber according to one embodiment of the invention.

In the following description, numerous specific details are set forth in order to provide a thorough understanding of various illustrative embodiments of the invention. It will be understood, however, to one skilled in the art, that embodiments of the invention may be practiced without some or all of these specific details. In other instances, well known process operations have not been described in detail in order not to unnecessarily obscure pertinent aspects of embodiments being described.

Embodiments described in the context of one of the methods, apparatus, or systems are analogously applicable to the other methods, apparatus, or systems. Similarly, embodiments described in the context of a method are analogously applicable to an apparatus or system, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the drawings, like reference numerals refer to same or similar functionalities or features throughout the several views. The particular arrangements shown in the drawings should not be viewed as limiting. It should be understood that other embodiments can include more or less of each element shown in a given figure. Some of the illustrated elements can be combined or omitted.

In the context of various embodiments, including examples and claims, the articles "a", "an" and "the" as used with regard to a feature or element include a reference to one or more of the features or elements. The terms "comprising," "including," "having", and their variations are intended to be open-ended and mean that there may be additional features or elements other than the listed ones. The term "and/or" includes any and all combinations of one or more of the associated listed items. Identifiers such as "first", "second" and "third" are used merely as labels, and are not intended to impose numerical requirements on their objects, nor construed in a manner imposing any relative position or time sequence between limitations. The term "coupled" may refer to physically coupling, electrically coupling, and/or communicably coupling. The term "coupled" when applied to two objects may refer to the two objects being coupled directly or indirectly through a third object. The term "arranged at" may include references to "coupled to". The term "supporting" when applied to two objects may refer to a first object being supported directly by a second object or indirectly through a third object.

Aspects of the invention provide for a burn-in apparatus for performing burn-in process on the semiconductor devices or integrated circuits, the apparatus comprising of a burn-in chamber and one or more interchangeable frames each adapted to be removably moved into and docked in the burn-in chamber, and methods for transferring in and out burn-in boards by respectively completing and uncompleting the thermal insulation of a burn-in chamber.

A burn-in apparatus comprises of a burn-in chamber with an incomplete base which is adapted to be completed and thermally insulated in cooperation with the thermal insulation base of at least one interchangeable frame which is adapted to be removably moved into and docked in the burn-in chamber. More particularly, the burn-in apparatus comprises a burn-in chamber (alternatively referred to as "chamber") having at least one side opening and at least one base opening, and at least one door or cover adapted to close or seal the side opening and provide thermal insulation thereto. The base opening is closable or sealable by a thermal insulation base of a frame when the frame is moved into the chamber and docked therein. When both side opening and base opening are closed, thermal insulation of the burn-in chamber is completed. Remaining portions of the chamber, i.e. other than the aforementioned side opening and base opening, may be thermally insulated.

The burn-in apparatus may be coupled to or cooperate with at least one burn-in driver or test apparatus adapted to be connected to burn-in boards and to provide and/or receive power and/or electrical signals to the semiconductor devices arranged in and/or connected to the burn-boards. The burn-in driver may be arranged external of the chamber. The chamber is adapted to accommodate at least one frame supporting burn-in boards. The complete assembly of the burn-in apparatus, comprising the chamber and the frame, and burn-in driver forms the burn-in system.

The frame provides a carrier of burn-in boards and semiconductor devices. The frame is suitably constructed and dimensioned to be removably moved into and docked in the burn-in chamber. The frame comprises at least one rack, at least one thermal insulation base (alternatively referred to as "insulation base") suitably located at the frame, e.g. bottom of the frame, such that when the frame is docked in the chamber, the insulation base abuts at least a portion of the chamber which at least partially defines the base opening, and thereby closing the base opening and providing thermal insulation to the base opening of the chamber. The insulation base includes a first side and a second side which may be opposite, or transverse, or otherwise appropriately oriented to the first side, e.g. same or different direction. The rack is arranged at the first side of the insulation base, i.e. coupled to the insulation base and/or frame. Consequently, when the insulation base is arranged at the base opening of the chamber, the first side of the insulation base and the rack are arranged inside the chamber and therefore subject to the temperature condition of the chamber during burn-in process, while the second side of the insulation base is arranged outside the chamber, e.g. in the ambient environment or within a housing of the burn-in apparatus which is exterior of the chamber, and therefore not subject to the temperature condition of the chamber during burn-in process.

Figure 4:
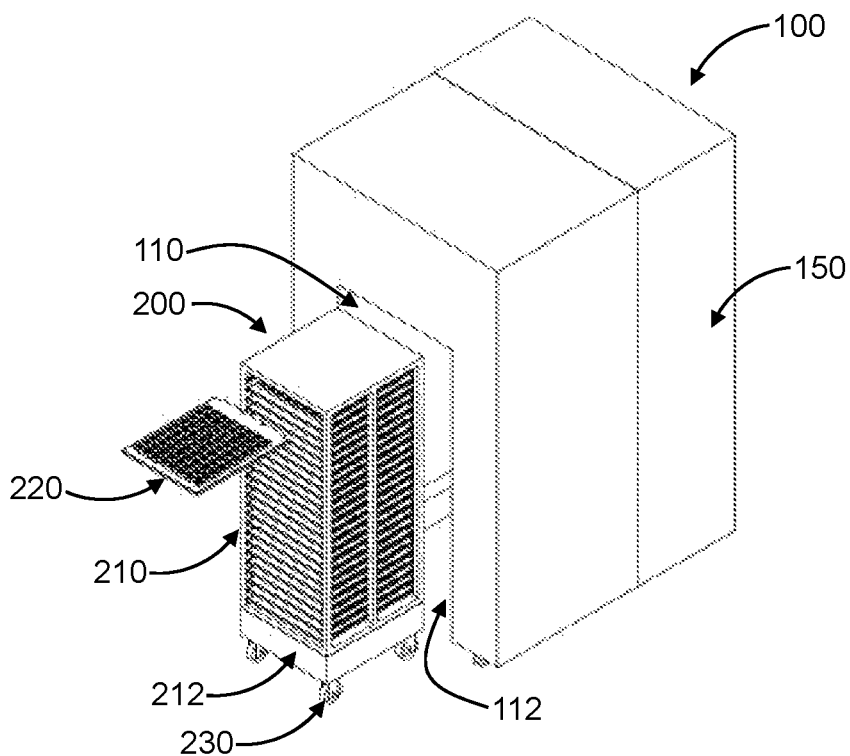
FIG. 4 is a perspective view showing an incomplete burn-in apparatus comprising the burn-in chamber of FIG. 1 and frame of FIG. 2.

FIGS. 1 and 4 show a burn-in apparatus 100 according to one embodiment of the invention. The burn-in apparatus 100 comprises a burn-in chamber 110 and a burn-in driver section 150 which may be arranged adjacent to the burn-in chamber 110. The burn-in driver section 150 may house burn-in driver or test apparatus, and associated components or circuitry. The chamber 110 provides at least two openings, e.g. base opening 112 and side opening 114. The base opening 112 may be provided at the bottom of the chamber 110. The chamber may comprise at least one thermal insulation side element 116 provided along at least partially along the base opening 112. The side element 116 may be an integral part of the chamber 110 or provided as at least one separate element coupled to the chamber 110. Dimensions defined by the insulation side element 116 and the base opening 112 are adapted to ensure the insulation side element 116 abuts the insulation base 212 of a compatible frame 200 to close the base opening 112 when the frame is moved into and docked in the chamber 110. The side opening 114 may be provided at a lateral side of the chamber 110 and may be arranged in fluid communication with the base opening 112, i.e. base opening 112 and side opening 114 intersect. Lateral side may refer to non-top or non-bottom side, and may be transverse to the bottom side. The side opening 114 allows transfer of the frame, e.g. loaded frame with burn-in boards, into and out of the chamber 110. The side opening 114 is closable by at least one door 120 or cover which may be movably coupled, e.g. by hinge, to the chamber 110 or burn-in apparatus 100, or by at least one door or cover which is detached or separate from the chamber 110 or burn-in apparatus 100. The door 120 when closed is adapted to provide thermal insulation to the side opening 114, however, even if the side opening 114 is closed by the door 120 while the compatible frame 200 is absent from or moved out from the chamber 110, thermal insulation of the chamber 110 is still incomplete due to the unfilled or uncovered base opening 112. The base opening 112 and the side opening 114 allow fluid communication between an interior of the chamber 110 and an exterior of the chamber 110 or ambient environment when at least one of them is not closed.

Figure 2:
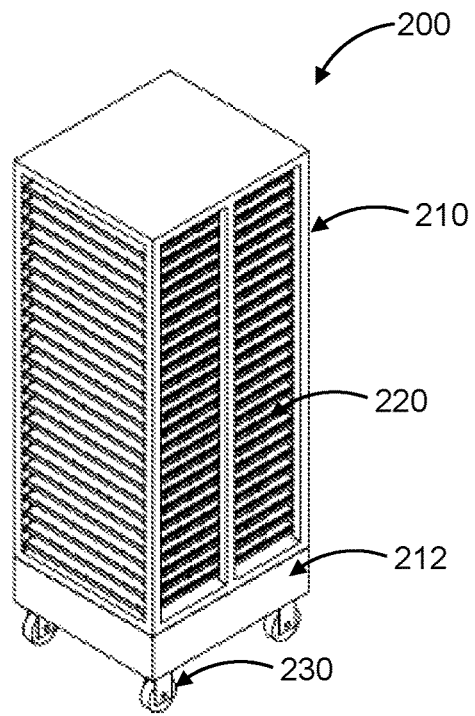
FIG. 2 shows a frame which is adapted to be moved into the burn-in chamber of FIG. 1.

FIGS. 2 and 4 show a frame 200 which is adapted to be removably docked in the burn-in apparatus 100 of FIG. 1. The frame 200 comprises a rack 210 for supporting one or more burn-in boards 220 which may be stacked or arranged in other configurations. The rack 210 may comprise other structural elements for directly or indirectly supporting the burn-in boards. The frame 200 further comprises a thermal insulation base 212 which may partially or fully form a bottom of the rack 210 or frame 200. In context of FIG. 2, the thermal insulation base 212 has a first side, e.g. top side, and a second side, e.g. bottom side. Although the first side and the second side may be mutually opposite as shown in FIG. 2, they may be mutually transverse or arranged on non-opposite sides in other examples as long as during burn-in process or when the frame 200 is docked in the chamber 110, the first side is arranged inside the chamber 110 while the second side is arranged outside the chamber 110. The frame 200 may further comprises wheels 230 arranged at the second side of the insulation base 212, e.g. rotatably coupled to the insulation base 212 and/or rack 210. Accordingly, during burn-in process or when the frame 200 is docked in the chamber 110, the wheels 230 are arranged outside the chamber 110. The wheels 230 may be electrostatic discharge (ESD) safe wheels which may be manual, power assisted, or are arrangements which are adapted to be used with autonomous guided vehicle (AGV). A combination of the frame 200 and its wheels 230 may also be referred to as a trolley.

The frame 200 of FIG. 2 may further comprises electronic circuitry (not shown) which are arranged at the second side of the insulation base 212. Accordingly, during burn-in process or when the frame 200 is docked in the chamber 110, the electronic circuitry is arranged outside the chamber 110 and therefore unaffected or not subject to at least the temperature condition of the chamber 110 during burn-in process. The electronic circuitry may include communication circuitry, e.g. transmitter, receiver, adapted to send and/or receive signals to one or more remote devices, e.g. communication device, by wired or wireless connection. The electronic circuitry may further include at least one sensor, computing processor or microprocessor, and/or memory device for storing instructions executable by the computing processor or microprocessor which may be communicably coupled to the communication circuitry, sensor, and/or memory device. The signals may provide information about the frame 200 being docked in the chamber 110, burn-in boards and/or semiconductor devices being supported by the particular frame 200. Such information may include location and/or characteristics of the particular frame 200, burn-in boards and/or semiconductors being supported by the particular frame 200.

Figure 3:
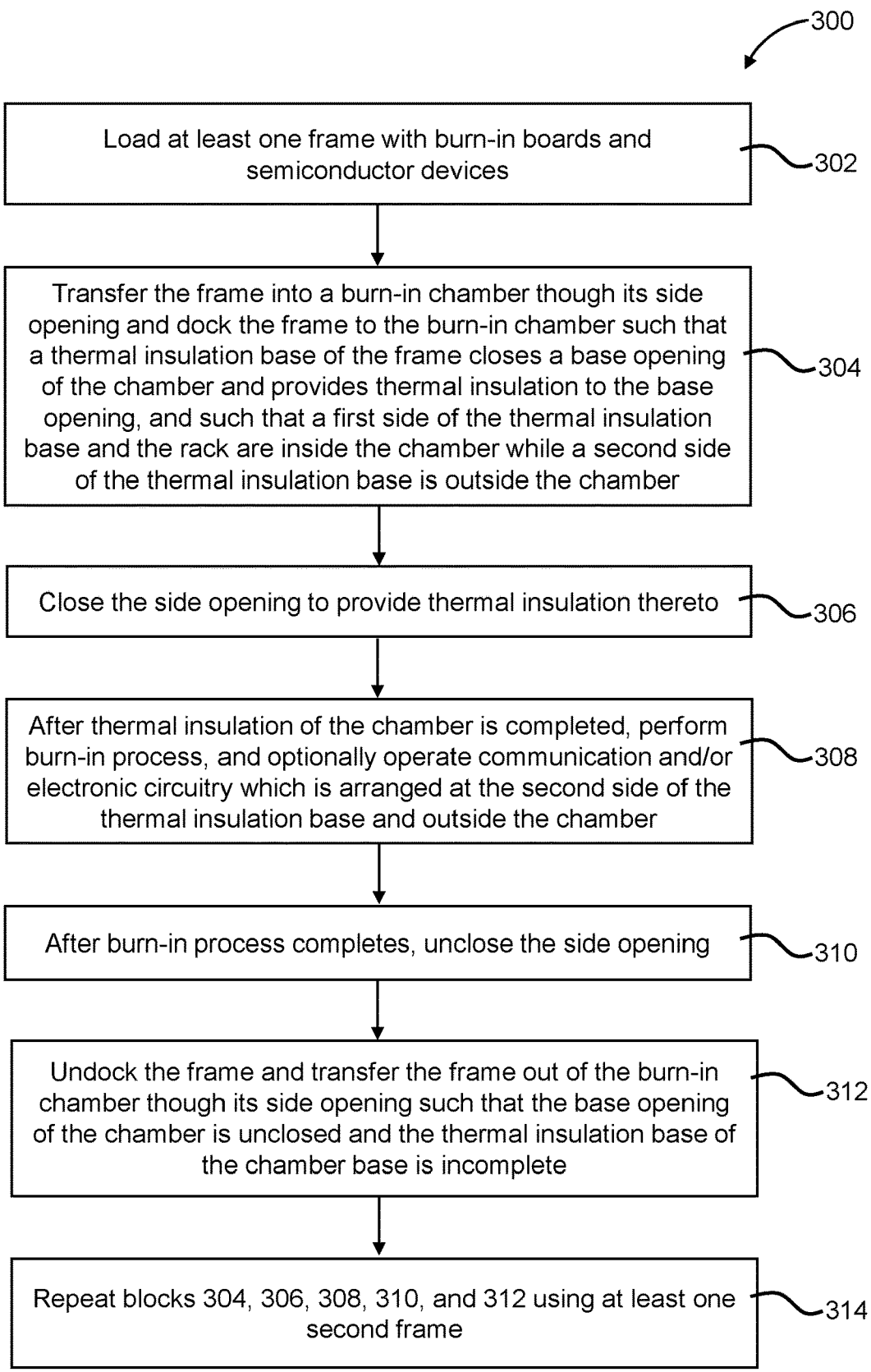
FIG. 3 shows a flow chart relating to a method for transferring burn-in boards in/out of a burn-in chamber according to one embodiment of the invention.

FIG. 3 shows a flow chart 300 for a method for transferring burn-in boards in/out of a burn-in chamber and according to one embodiment of the invention.

In block 302 of FIG. 3, at least one frame is loaded with a set of burn-in boards and semiconductor devices. Loading of semiconductor devices onto the set of burn-in boards may be performed by a burn-in load/unload apparatus (not shown) when the frame is docked therein.

In block 304 of FIG. 3, the loaded frame, including the rack supporting burn-in boards, are transferred into a burn-in chamber. During this transfer-in process, the loaded frame is progressively moved into the chamber through its side opening while a thermal insulation base of the frame progressively closes the base opening of the chamber; when the insulation base closes the base opening, the frame is docked in the chamber. In the docked position, the insulation base closes the base opening and provides thermal insulation thereto; a first side of the thermal insulation base and the rack are inside the chamber while a second side of the thermal insulation base are outside the chamber. This transfer of the set of burn-in boards into the chamber may include moving the frame from the burn-in load/unload apparatus to the chamber without unloading the set of burn-in boards from the rack or the frame.

In the embodiment of FIG. 2 in which the frame 200 is a trolley, transfer of the loaded frame 200 includes moving, e.g. pushing, the loaded trolley into the chamber 110. Closing the base opening includes abutting the thermal insulation base to at least one thermal insulation side element arranged at least partially along the base opening.

In block 306 of FIG. 3, the side opening is closed by using or actuating at least one or more doors or covers designated for this purpose.

Figure 5A:
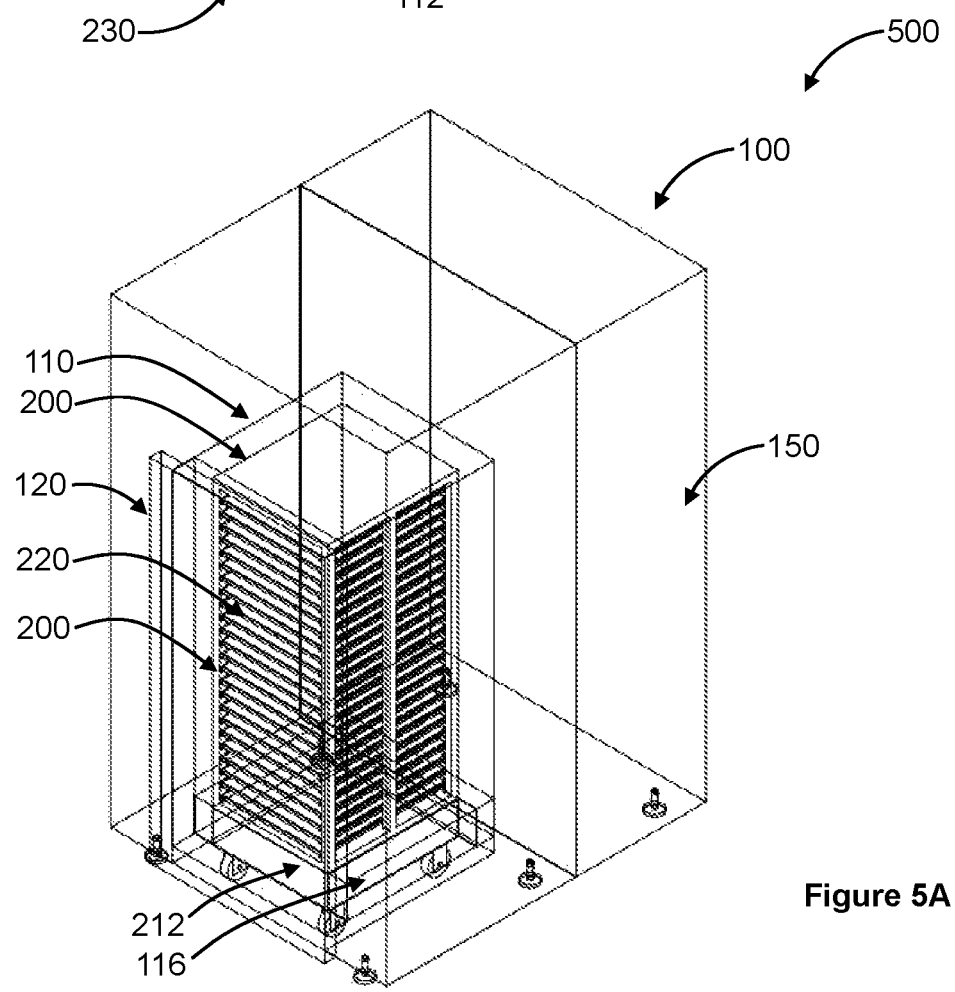
FIG. 5A is a perspective view showing a completed burn-in apparatus when the frame of FIG. 2 is removably docked in the burn-in chamber of FIG. 1.
Figure 5B:
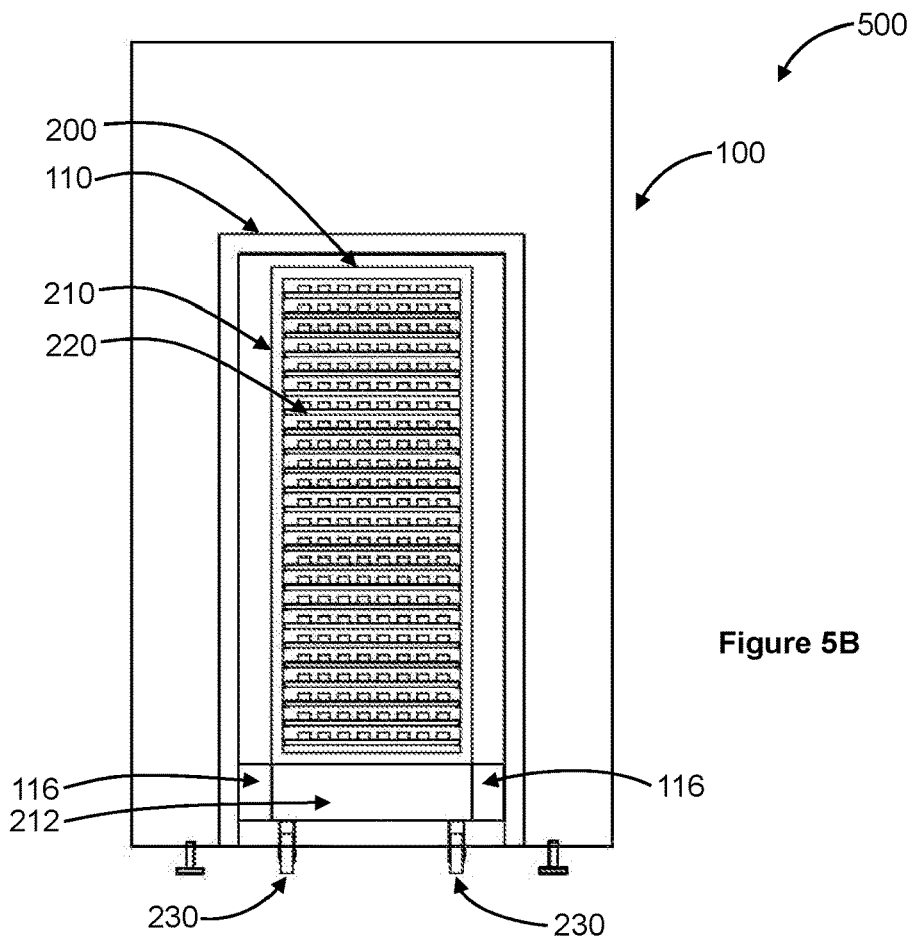
FIG. 5B is a see-through view taken from the front of FIG. 5A.
Figure 5C:
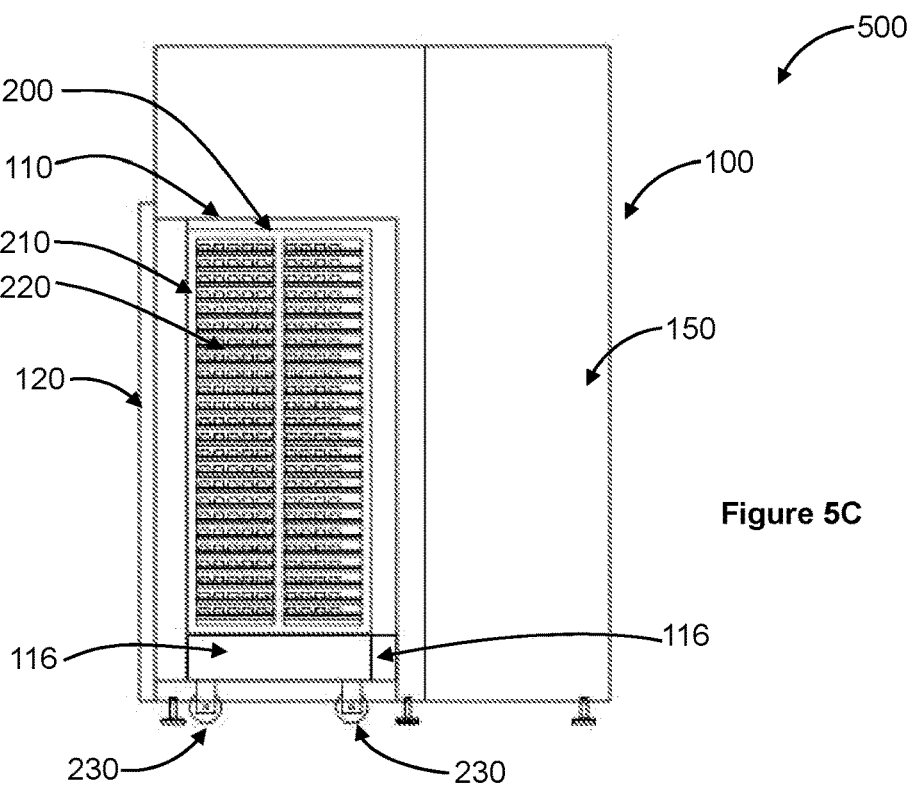
FIG. 5C is a see-through view taken from the side of FIG. 5A.

When the base opening is closed by docking the frame in the chamber, and the side opening is also closed, thermal insulation of the chamber is completed, e.g. see FIGS. 5A to 5C showing a burn-in system having a completed thermal insulation.

In block 308 of FIG. 3, burn-in process takes place or is performed in the chamber. Temperature inside the chamber is set to the desired temperature. The burn-in boards supported by the frame as well as the first side of the insulated base of the frame are exposed to the chamber temperature. The second side of the insulated base, together with any wheels and/or any communication and electronic circuitry, is outside the chamber and hence non-exposed to the chamber temperature and therefore remains at ambient temperature. During burn-in process, the electronic circuitry may operate, e.g. communication circuitry may operate to send and/or receive signals to one or more devices, e.g. communication device, remote from the burn-in apparatus.

In block 310 of FIG. 3, burn-in process completes. The side opening is unclosed, e.g. the door or cover is opened to allow access to the chamber through the side opening.

In block 312, the loaded frame is transferred out of the chamber. During this transfer-out process, the base opening is unclosed or revealed by undocking the loaded frame from the chamber and progressively moving out of the chamber through the side opening until the frame is outside or away from the base opening. In the undocked position, the insulation base uncloses or reveals the base opening, hence the thermal insulation of the chamber base is incomplete even if the side opening may be closed. The frame may be transferred into the burn-in load/unload apparatus without unloading the set of burn-in boards from the rack or the frame. At the burn-in load/unload apparatus, the semiconductor devices that had completed the burn-in process may be unloaded from the set of burn-in boards.

In the embodiment of FIGS. 4 and 5A, unclosing the base opening includes un-abutting the thermal insulation base to at least one thermal insulation side element arranged at least partially along the base opening.

In block 314 of FIG. 3, at least one second loaded frame supporting a second set of burn-in boards and semiconductor devices is transferred into the chamber in the same manner as described with reference to block 304; the side opening is closed as described with reference to block 306; burn-in process and optional electronic and/or communication operation are performed as described with reference to block 308; after burn-in process completes, the side opening is unclosed as described with reference to block 310; the second frame is transferred out of the chamber as described with reference to block 312. The second frame used in block 314 and the frame used in block 304 may be different but interchangeable, i.e. the second frame used in block 314 is arranged outside the chamber when the frame used in block 304 is docked in the chamber during burn-in process.

FIGS. 5A to 5C show a completed burn-in system 500 which incorporates the burn-in apparatus 100 of FIG. 1 and frame 200 of FIG. 2. The system 500 comprises a burn-in apparatus 100 having a chamber 110 having at least one side opening and at least one base opening which are devoid of thermal insulation when they are unclosed. The system 500 further comprises at least one frame 200 which is movable through the side opening and removably dockable in the chamber 110, wherein the frame 200 includes a thermal insulation base 212 having a first side and a second side. When the frame 200 is docked in the chamber 110, the insulation base 212 is arranged at, e.g. fitted or engaged within, the base opening 112 to abut the chamber and/or its insulation side element 116, thereby closing the base opening 112, and providing thermal insulation thereto. When the frame 200 is docked in the chamber 110 and the side opening 114 is closed, thermal insulation of the chamber 110 is completed; and the first side of the insulation base 212 is arranged inside the chamber 110 while the second side is arranged outside the chamber 110. The system 500 further comprises at least one burn-in driver or test apparatus (not shown) housed inside burn-in driver section 150.

It is to be appreciated that the above-described and/or illustrated embodiments may be modified or varied as described below.

In one embodiment, the chamber may accommodate more than one frame and therefore have one or more base openings and one or more side openings. Accordingly, the base opening(s) may be closable by docking two or more frames in the chamber. Each frame provides a thermal insulation base such that a combination of the insulation bases abuts the chamber and/or its insulation side element to close the base opening(s). In one example, multiple frames are adjacently arranged to close a single base opening while in another example, multiple frames are arranged to respectively close multiple base openings. In one example, all docked frames are loaded with burn-in boards while in another example, at least one docked frame is devoid of burn-in boards or is non-loaded but is necessarily docked in the chamber in order to close the base opening(s) to complete thermal insulation of the chamber.

In the embodiment shown in the Figures, thermal insulation side element may be provided along three sides of the base opening. In some other embodiments (not shown), the insulation side element may be provided along one or more sides of the base opening, continuously or intermittently arranged. In yet some other embodiments, no insulation side element may be provided along any side of the base opening(s). In other words, the insulation base of the frame is configured to abut the chamber in mutual direct contact.

In the embodiment shown in Figures, dimensions of the insulation base of the frame may be substantially the same as or slightly smaller than the dimensions of the base opening of the chamber. As such, in the docked position, the insulation base is fitted or engaged in the base opening. In some other embodiments (not shown), dimensions of the insulation base of the frame may be larger than the dimensions of the base opening of the chamber. In one example of such embodiments, when the frame is docked in the chamber, instead of fitting the insulation base in the base opening, the thermal insulation base may be arranged under or adjacent to both the chamber and base opening but abutting the chamber to cover or close the base opening. In another example of such embodiments, when the frame is docked in the chamber, at least one portion of the insulation base is fitted or engaged in the base opening while at least another portion of the insulation base is arranged outside the base opening. It is to be appreciated that in the foregoing and other embodiments, abutting the thermal insulation base to the chamber to cover or close the base opening includes arranging the insulation base at the base opening, such arrangement includes arranging in, under, or adjacent to the base opening.

In one embodiment, the insulation base is cut-out or removed from the burn-in chamber and coupled to the frame and/or rack.

In one embodiment, multiple frames may be compatible with the burn-in apparatus. The multiple frames may have different arrangements for supporting different types of burn-in boards, however, their overall construction and dimensions, including their insulation bases, are adapted to be compatible with the burn-in apparatus in order to allow docking in the chamber and thus completion of thermal insulation thereof.

In one embodiment, no wheel may be provided to the frame. As such, a vehicle may be required to transfer the frame into and out of the burn-in chamber. The vehicle may be human-operated and/or automated, e.g. autonomous guided vehicle (AGV), autonomous robot vehicle (ARV).

In one or more embodiments, the wheels of the frame may be manual or power-assisted, or the frame may alternatively or additionally include arrangements, e.g. coupling or engagement elements, which are adapted to be used with autonomous guided vehicle (AGV). The frame may comprise power supply and motor which may be arranged on the second side of the insulation base such that these components are arranged outside of the chamber during burn-in process.

In one embodiment, the wheels may not be electrostatic discharge (ESD) safe wheels.

It is to be appreciated that the above-described embodiments may be selectively combined. It is also to be appreciated that the above-described modifications or variations and combinations may apply to method as described with reference to FIG. 3.

Embodiments of the invention provide several advantages including but not limited to the following:

(i) The invention eliminates manual transfer of burn-in boards or burn-in board racks to/from the burn-in chamber. Instead of manually transferring burn-in boards or burn-in board racks into or out of the burn-in chamber, the invention provides for interchangeable frames carrying the burn-in boards to be moved directly into or out of the burn-in chamber.

Compared to the first existing method described in the Background, the invention minimizes operator fatigue and reduces damage to burn-in boards due to manual handling.

Compared to the second existing method described in the Background, the invention does not require a bulky trolley or manual transfer of burn-in board racks therefore minimizing safety and crash hazard.

It is to be appreciated that footprint of the frame of the invention is much smaller, lighter, cheaper, easier to operate, and requires lesser maintenance compared to the bulky trolley with burn-in board racks. It also has a smaller turning radius enabling a more narrow walkway in the production area thus saving precious floor space.

It is also to be appreciated that, in the invention, after the frame is docked in the chamber, there is no more empty wheel rack or empty trolley to be moved away and parked at designated location, thus freeing the operator of additional steps and also saving precious production floor space.

(ii) The invention enables seamless integration, simplified transfer and facilitates automation between the burn-in apparatus and at least one other apparatus in the burn-in area.

It is to be appreciated that, in the invention, the same frame which is moved into the chamber can also be moved into at least one other apparatus in the burn-in area, e.g. burn-in load/unload apparatus, burn-in board pre-check apparatus, burn-in board storage apparatus, burn-in board cleaning apparatus, for various operations. In other words, there is no unloading or loading of burn-in boards from/onto the frame during transportation of burn-in boards from the burn-in apparatus to at least one other apparatus in the burn-in area, and vice versa.

It is also to be appreciated that during burn-in process, the second side or under side of the insulated base together with the wheels or arrangements adapted to be used with autonomous guided vehicle (AGV) remain outside the chamber and are exposed only to ambient condition. This enables mounting of automated drive, sensor and/or electronic circuitry on the underside of the frame to simplify transfer and facilitate automation between the burn-in apparatus and at least one other apparatus in the burn-in area.

(iii) The invention enables location tracking of burn-in boards which otherwise would be not feasible in existing methods. In existing methods described in the Background, the burn-in boards as well as the burn-in board rack(s) are fully enclosed in the metallic structure of the burn-in chamber and exposed to high/low temperature which environment renders powered or non-powered wireless location tracking device unusable, or requires extremely expensive devices.

In the invention, during burn-in, only the first side of the insulated base, rack and burn-in boards remain in the chamber and are exposed to the hot/cold temperature condition, while the second side of the insulated base and wheels or arrangements adapted to be used with autonomous guided vehicle (AGV) remain outside the chamber and is exposed only to ambient condition. This enables mounting of powered or non-powered location tracking device, sensor, and electronic circuitry on the second side of the frame to facilitate location tracking of the frame and burn-in board(s) in the entire burn-in area, even when the burn-in boards are fully enclosed in the metallic structure of the burn-in apparatus and exposed to high/low temperature.

It is to be understood that the embodiments and features described above should be considered exemplary and not restrictive. Many other embodiments will be apparent to those skilled in the art from consideration of the specification and practice of the invention. Furthermore, certain terminology has been used for the purposes of descriptive clarity, and not to limit the disclosed embodiments of the invention.

The invention claimed is:

1. A burn-in apparatus for performing burn-in process on the semiconductor devices or integrated circuits, the apparatus comprising:
   a burn-in chamber having at least one side opening and at least one base opening;
   at least one door or cover adapted to close the side opening;
   at least one interchangeable frame wherein each frame of the at least one interchangeable frame comprises a thermal insulation base forming a bottom thereof, and a rack arranged at a first side of the thermal insulation base,
   wherein the at least one interchangeable frame is configured to be movable through the side opening to be removably docked in the chamber, thereby fitting the thermal insulation base within the base opening to abut the chamber such that the thermal insulation base closes and thermally insulates the base opening,
   wherein a thermal insulation of the chamber is completed when the side opening is closed, and the rack and the first side of the thermal insulation base are inside the chamber while a second side of the thermal insulation base is outside the chamber.

2. The burn-in apparatus of claim 1, wherein the chamber includes at least one thermal insulation side element arranged at least partially along the base opening and adapted to abut the thermal insulation base when each frame is removably docked in the chamber.

3. The burn-in apparatus of claim 1, wherein each frame further includes wheels which are manual or power assisted, or arrangements which are adapted to be used with autonomous guided vehicle (AGV), wherein the wheels or the arrangements are arranged at the second side of the thermal insulation base.

4. The burn-in apparatus of claim 1, further comprising: electronic circuitry arranged at the second side of the thermal insulation base, the electronic circuitry includes one or more selected from the group consisting of: communication circuitry, sensor, memory storage, and microprocessor, and is configured to send and/or receive signals at least while the at least one frame is removably docked in the chamber and burn-in process is taking place in the chamber.

5. The burn-in apparatus of claim 1, wherein the at least one frame is two or more frames, and wherein at least one of the two or more frames is loaded with burn-in boards and wherein at least another of the two or more frames is devoid of burn-in board.

6. The burn-in apparatus of claim 1, further comprising: a plurality of second frames arranged outside the chamber, wherein the at least one frame is interchangeable with at least one of the second frames.

7. A method comprising:
   transferring at least one frame having a set of burn-in boards into a chamber, wherein each frame of the at least one frame comprises a thermal insulation base forming a bottom thereof, and a rack which is arranged at a first side of the thermal insulation base and supports the set of burn-in boards, wherein transferring the at least one frame having the set of burn-in boards into the chamber includes moving the at least one frame into the chamber through a side opening thereof to removably dock the at least one frame in the chamber, thereby fitting the thermal insulation base within the base opening to abut the chamber, such that the thermal insulation base closes and thermally insulates the base opening;
   completing a thermal insulation of the chamber, including:
      closing the side opening, thereby having the rack and the first side of the thermal insulation base inside the chamber while a second side of the thermal insulation base is outside the chamber; and
   performing burn-in process on semiconductor devices arranged in the set of burn-in boards.

8. The method of claim 7, further comprising:
   uncompleting thermal insulation of the chamber, including:
      unclosing the side opening, and
      unclosing the base opening by undocking the at least one frame from the chamber;
   transferring the set of burn-in boards out of the chamber by moving the at least one frame out of the chamber through the side opening.

9. The method of claim 8, wherein after transferring the set of burn-in boards out of the chamber, the method further comprising:
   transferring a second set of burn-in boards into the chamber by moving at least one second frame into the chamber through the side opening thereof, wherein each second frame includes a second thermal insulation base and a second rack which is arranged at the first side of the second thermal insulation base and supports the second set of burn-in boards;

completing thermal insulation of the chamber, including:
closing the base opening of the chamber by docking the at least one second frame in the chamber by abutting the second thermal insulation base to the chamber such that the second rack and the first side of the second thermal insulation base are inside the chamber while a second side of the second thermal insulation base is outside the chamber, and
closing the side opening by the door or cover; and
performing burn-in process on the semiconductor devices arranged in the second set of burn-in boards supported by the second frame.

10. The method of claim 7, wherein closing the base opening of the chamber includes:
abutting the thermal insulation base to at least one thermal insulation side element arranged at least partially along the base opening.

11. The method of claim 8, wherein unclosing the base opening of the chamber includes:
un-abutting the thermal insulation base from at least one thermal insulation side element arranged at least partially along the base opening.

12. The method of claim 7, wherein docking the at least one frame in the chamber includes:
arranging wheels which are manual or power assisted, or arrangements which are adapted to be used with autonomous guided vehicle (AGV), wherein the wheels or the arrangements are arranged at the second side of the thermal insulation base and outside the chamber.

13. The method of claim 7, further comprising: while performing burn-in process on the semiconductor devices arranged in the burn-in boards,
operating electronic circuitry which is arranged at the second side of the thermal insulation base, and/or
operating communication circuitry which is arranged at the second side of the thermal insulation base, including sending and/or receiving signals via the communication circuitry.

14. The method of claim 7, wherein transferring the set of burn-in boards into the chamber includes moving the frame from the burn-in load/unload apparatus to the chamber without unloading the set of burn-in boards from the rack or the frame,
wherein prior to transferring the set of burn-in boards into the chamber, the method further comprising:
transferring the frame with the set of burn-in boards into the burn-in load/unload apparatus; and
loading, by the burn-in load/unload apparatus, the semiconductor devices onto the set of burn-in boards.

15. The method of claim 8, wherein transferring the set of burn-in boards out of the chamber includes transferring the frame into the burn-in load/unload apparatus without unloading the set of burn-in boards from the rack or the frame, the method further comprising:
unloading, by the burn-in load/unload apparatus, the semiconductor devices that had completed the burn-in process from the set of burn-in boards.

16. The method of claim 8, wherein transferring the set of burn-in boards into or out of the chamber includes transferring the frame between the burn-in apparatus and at least one other apparatus in a burn-in area, which is selected from the group consisting of: burn-in load/unload apparatus, burn-in board pre-check apparatus, burn-in board storage apparatus, burn-in board cleaning apparatus, without unloading the set of burn-in boards from the rack or the frame.

17. A burn-in chamber comprising:
a chamber having at least one side opening and at least one base opening intersecting the side opening,
wherein at least the base opening, when unclosed, is configured to allow fluid communication between an interior of the chamber and an exterior of the chamber and to incomplete a thermal insulation of the chamber,
wherein the base opening is closable upon a removable docking of at least one frame in the chamber, wherein the removable docking is configured to fit a thermal insulation base, which forms a bottom of the at least one frame, within the base opening to abut the chamber, and
wherein the thermal insulation of the chamber is configured to be completed when the side opening is closed and the base opening is closed.

18. The burn-in chamber of claim 17, wherein the chamber includes at least one thermal insulation side element arranged at least partially along the base opening such that when each frame is removably docked in the chamber, the thermal insulation base of the frame is arranged at the base opening and abuts the at least one thermal insulation side element.

19. A frame comprising:
a rack carrying a plurality of burn-in boards; and
a thermal insulation base having a first side and a second side, wherein the rack is arranged at the first side of the thermal insulation base,
wherein the thermal insulation base is configured to be fitted within a base opening of a burn-in chamber to abut the burn-in chamber upon removably docking the frame in the burn-in chamber, and wherein a thermal insulation of the burn-in chamber is configured to be completed when a side opening of the burn-in chamber is closed, such that the rack, the burn-in boards, and the first side of the thermal insulation base are inside the burn-in chamber and exposed to a temperature condition of the burn-in chamber while the second side of the thermal insulation base is outside the burn-in chamber and exposed to an ambient condition.

20. The frame of claim 19, further comprising: wheels which are manual or power assisted, or arrangements which are adapted to be used with autonomous guided vehicle (AGV), wherein the wheels or the arrangements are arranged at the second side of the thermal insulation base.

21. The frame of claim 19, further comprising: electronic circuitry arranged at the second side of the thermal insulation base, the electronic circuitry includes one or more selected from the group consisting of: communication circuitry, sensor, memory storage, and microprocessor, and is configured to send and/or receive signals at least when the frame is removably docked in the burn-in chamber.

22. The frame of claim 19, wherein the frame provides a common carrier of the plurality of burn-in boards for the burn-in chamber and at least one other apparatus in a burn-in area, which is selected from the group consisting of: burn-in load/unload apparatus, burn-in board pre-check apparatus, burn-in board storage apparatus, burn-in board cleaning apparatus, wherein the frame, including the rack, the burn-in boards, and the thermal insulation base, is removably dockable to the at least one other apparatus in the burn-in area.

\* \* \* \* \*